(12) United States Patent
Lien et al.

(10) Patent No.: US 8,263,432 B2
(45) Date of Patent: Sep. 11, 2012

(54) MATERIAL COMPOSITION HAVING CORE-SHELL MICROSTRUCTURE USED FOR VARISTOR

(75) Inventors: Ching-Hohn Lien, Taipei (TW); Cheng-Tsung Kuo, Banqiao (TW); Jun-Nan Lin, Zhubei (TW); Jie-An Zhu, Shanghai (CN); Li-Yun Zhang, Shanghai (CN); Wei-Cheng Lien, Taipei (TW)

(73) Assignee: Bee Fund Biotechnology Inc. (TW)

( * ) Notice: Subject to any disclaimer, the term of this patent is extended or adjusted under 35 U.S.C. 154(b) by 407 days.

(21) Appl. No.: 11/798,800

(22) Filed: May 17, 2007

(65) Prior Publication Data

US 2008/0286898 A1    Nov. 20, 2008

(51) Int. Cl.
*H01L 21/02* (2006.01)

(52) U.S. Cl. .......... 438/104; 252/519.5; 252/520.1; 252/520.2; 428/402.21; 428/402.24; 428/403

(58) Field of Classification Search .......... 438/104; 252/519.5, 520.1, 520.2, 520.3, 521.2, 521.3, 252/521.4, 521.6, 14, 512, 513; 428/403
See application file for complete search history.

(56) References Cited

U.S. PATENT DOCUMENTS

| 3,347,799 | A  | * | 10/1967 | Wagner | 252/514 |
| 3,846,345 | A  | * | 11/1974 | Mason et al. | 252/514 |
| 5,798,060 | A  | * | 8/1998  | Brevett | 252/520.1 |
| 2001/0009692 | A1 | * | 7/2001 | Watanabe | 427/242 |
| 2005/0057867 | A1 | * | 3/2005 | Harris et al. | 361/56 |

* cited by examiner

*Primary Examiner* — James J Seidleck
*Assistant Examiner* — S. Camilla Pourbohloul
(74) *Attorney, Agent, or Firm* — Bacon & Thomas, PLLC

(57) ABSTRACT

A material composition having a core-shell microstructure suitable for manufacturing a varistor having outstanding electrical properties, the core-shell microstructure of the material composition at least comprising a cored-structure made of a conductive or semi-conductive material and a shelled-structure made from a glass material to wrap the cored-structure, and electrical properties of the varistors during low temperature of sintering process can be decided and designated by precisely controlling the size of the grain of the cored-structure and the thickness and insulation resistance of the insulating layer of the shelled-structure of material composition.

3 Claims, 1 Drawing Sheet

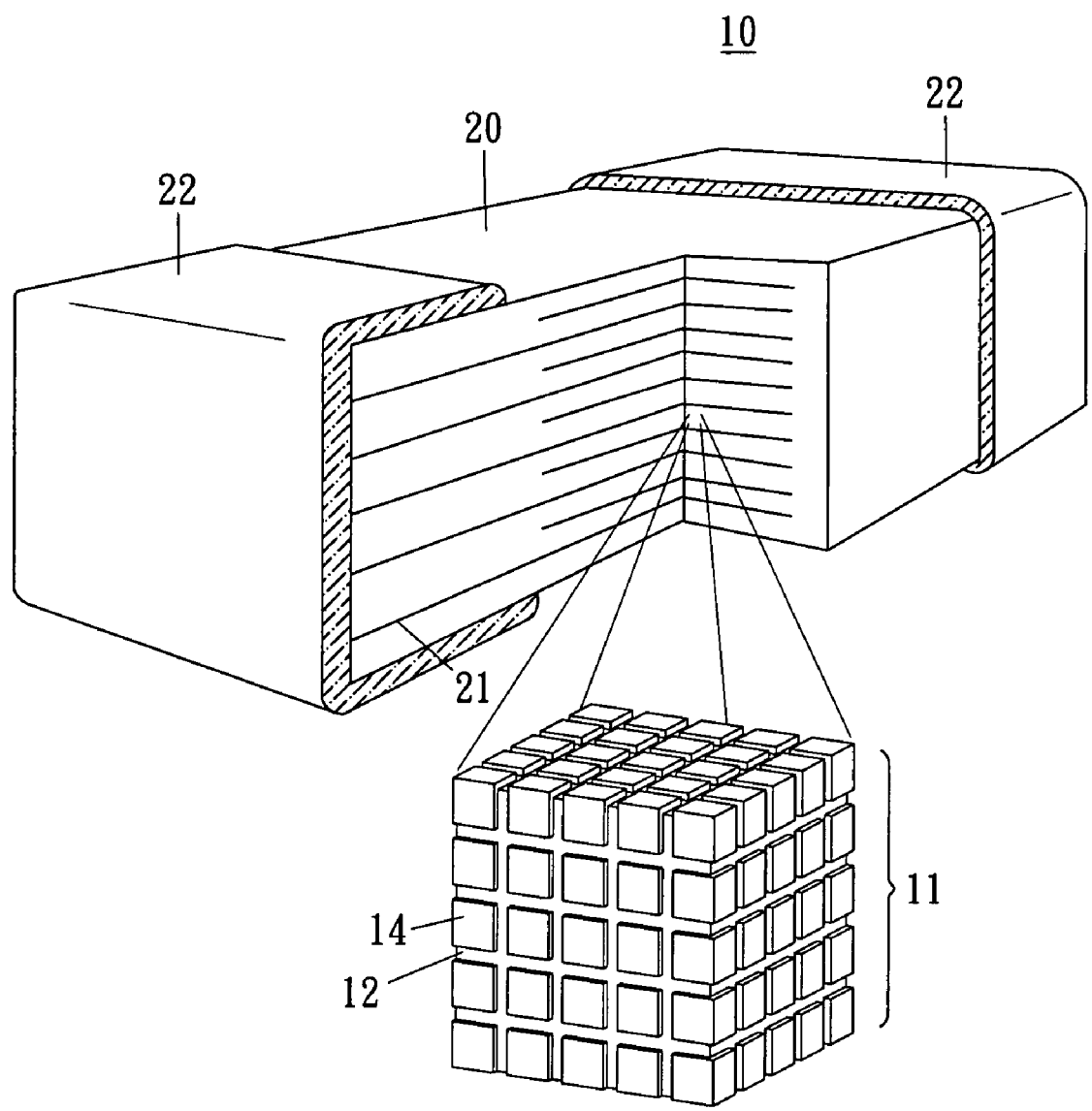

MATERIAL COMPOSITION HAVING CORE-SHELL MICROSTRUCTURE USED FOR VARISTOR

BACKGROUND OF THE INVENTION

1. Field of the Invention

The present invention relates to a material composition for a varistor and more particularly, to a material composition can be observed in a microstructure of a varistor wherein the material composition has a core-shell structure.

2. Description of the Related Art

In the electronic industry, the current trend is towards higher operational frequency and smaller volume. Thus, varistors or surge absorbers are conventionally used in high-frequency applications for protecting IC from getting damaged due to overvoltage.

Various materials, such as $SrTiO_3$, SiC, ZnO, $Fe2O_3$, $SnO_2$, $TiO_2$, $BaTiO_3$ and Diode, may be implemented to absorb surge. However, since the materials present diverse characteristics in surge absorbent abilities, static absorbent abilities and other properties, not all of the mentioned materials can be applied in manufacture and practical applications.

A silicon diode provides surge absorbent ability relying on the PN interface. A varistor made from this material disadvantageously possesses relatively higher breakdown voltage and inferior surge absorbent ability.

Varistors constructed of $Fe_2O_3$ and $BaTiO_3$ have the surge absorbent ability relying on the interface between electrodes and ceramics. However, such varistors present inferior electrical properties and are unsuitable for making high-voltage components.

The surge absorbent ability of varistors made from ZnO, $TiO_2$, $SnO_2$ or $SrTiO_3$ typically depends on the interface between semi-conductive grains and grain-boundary insulating layers. However, the grain-boundary insulating layers are primarily composed of crystalline phases, such as crystalline phases of $\alpha$-$Bi_2O_3$, $Na_2O$ or $SrTiO_3$. Thus, the disadvantage of such varistors is that the production of the grain-boundary insulating layers requires sintering at a relatively higher temperature.

SUMMARY OF THE INVENTION

The present invention has been accomplished under these circumstances in view. It is one objective of the present invention to provide a novel material composition for a varistor. The disclosed material composition has a core-shell microstructure at least comprising a cored-structure made of a conductive or semi-conductive material and a shelled-structure made from a glass material to wrap the cored-structure.

Particularly, varistors constructed from the disclosed material composition can be produced through sintering the material composition at a relatively lower temperature, which is typically between 600° C. and 1,100° C. Besides, the electrical properties of such varistors can be decided and designated through adjusting some particular parameters such as the size and properties of the grain of the cored-structure, the thickness and insulation resistance of the insulating layer of the shelled-structure, and the interval between two parallel electrodes and the overlap area of the electrode materials of the varistors.

It is another objective of the present invention to provide a novel material composition for both single-layered varistors and multiple-layered varistors, and the electrical properties of the varistors can be decided and designated during manufacturing for meeting various practical needs.

It is another objective of the present invention to provide a method for manufacturing a varistor with designated voltage. The method comprises sintering a novel material composition having a core-shell microstructure at a relatively lower temperature. In sintering at lower temperature, since the shelled-structure of the novel material composition is made from a glass material which has almost no reaction with the material of the cored-structure of the material composition, electrical properties of such varistors can be decided and designated by precisely controlling the size and properties of the grain of the cored-structure, the thickness and insulation resistance of the insulating layer of the shelled-structure, and the interval between two parallel electrodes and the overlap area of the electrode materials of the varistors.

BRIEF DESCRIPTION OF THE DRAWINGS

FIG. 1 is a schematic drawing of a varistor constructed of a novel material composition having a core-shell microstructure of the present invention.

DETAILED DESCRIPTION OF THE PREFERRED EMBODIMENT

As shown in FIG. 1, the disclosed material composition 11 of the present invention has a core-shell microstructure which at least comprises a shelled-structure 12 and a cored-structure 14 wrapped by the shelled-structure 12.

In particular, the cored-structure 14 of the core-shell microstructure of the material composition 11 is made of a conductive or semi-conductive material, and the shelled-structure 12 of the core-shell microstructure is made form a glass material that wraps the cored-structure 14.

The material composition 11 of the present invention may be in application of being manufactured into a ceramic component 20 for a varistor 10 through a standard ceramic processing.

The conductive material used as the cored-structure 14 of the core-shell microstructure of the material composition 11 of the present invention can be one of, a combination of two or more of or a combination of alloys of the metals selected from the group consisting of Fe, Al, Ni, Cu, Ag, Au, Pt and Pd.

The semi-conductive material used as the cored-structure 14 of the core-shell microstructure of the material composition 11 of the present invention can be one of, or a combination of two or more of the metals selected from the group consisting of ZnO, $SrTiO_3$, $BaTiO_3$, SiC, $TiO_2$, $SnO_2$, Si and GaAs.

The cored-structure 14 of the core-shell microstructure of the material composition 11 of the present invention can alternatively be made with a combination of the aforementioned conductive materials and semi-conductive materials.

The glass material used as the shelled-structure 12 of the core-shell microstructure of the material composition 11 of the present invention can be selected from the group consisting of silicate glass, boron glass, alumina-silica glass, phosphate glass and lead glass.

Referred to FIG. 1, the material composition 11 of the present invention can be used to manufacture a varistor 10 which provides outstanding electrical properties through the manufacturing steps described below.

1. Firstly, a proper metal conductor, a semi-conductive metallic oxide or a general semi-conductive material is suitably selected and soaked into a sol-gel having the formula containing silicate glass, boron glass, lead glass or phosphate glass. Thus, as a result of heterogeneous precipitation, the surface of the grain of the metal conductor or semi-conductive material can be wrapped by a layer of the material containing glass.

Then the resultant of core-shell combination is sintered at the temperature between 500° C. and 900° C. for 0.5 to 8 hours so that the layer of the inorganic or organic material containing glass wrapped around the surface of the conductor or the semi-conductive material can be turned in to a glass layer. By this way, a powderized material composition 11 of the present invention having a core-shell microstructure constructed of a cored-structure 14 wrapped by a shelled-structure 12 is realized.

2. For manufacturing a single-layered varistor 10, a lot of sintered and powderized material compositions 11 are mixed with appropriate binder and dispersant and formed under a forming pressure of 10000 lb/in² (psi). After a debinding process, the formation is sintered at a temperature between 600° C. and 1,100° C. for 0.5 to 4 hours to get a sintered ceramic body 20. Then the sintered ceramic body 20 is smeared with conductive silver paste at the upper and lower surface thereof and treated at a temperature between 500° C. to 800° C. as reduction process. Thereby, a single-layered varistor 10 of FIG. 1 is realized.

3. For manufacturing a multiple-layered varistor 10, a lot of sintered and powderized material compositions 11 are mixed with appropriate binder, dispersant, plasticizer and organic solvent to form a paste material having the formulated powders. Then doctor blade casting is conducted with the paste to make a green tape wherein the thickness of the green tape is made between 15 µm and 200 µm by adjusting the parameters such as the viscosity of the paste and the thickness of the blade during making the green tape.

Afterward, the green tape is cut into pieces with a predetermined size, and then, either a precious metal selected from one of the group consisting of platinum, silver, palladium, gold and rhodium or an alloy composed of any two of the precious metals is printed onto the pieced green tape as an inner electrode 21. Several pieces of the printed green tape are stacked in the manner that the ends of the inner electrodes alternately appear. After being covered by an upper lid and a lower lid and undergoing pressure equalization, the stack of the pieces is then cut at predetermined positions into green grains.

The green grains are further sintered in a sintering furnace at a temperature between 600° C. and 1,100° C. for 0.5 to 4 hours. Then at two ends of the sintered grains, where the inner electrodes 21 appear, are respectively formed as an outer electrode 22 after being coated with silver (Ag). The aforesaid composition is finally reduced at a temperature between 500° C. and 900° C. to realize the multiple-layered varistor 10.

4. At last, the basic electrical properties of the single-layered or multiple-layered varistor 10, including breakdown voltage (V1 mA), nonlinear exponent (α), leakage current (iL), ESD tolerance and restraining voltage, are measured. And, the definition of ESD tolerance is that when the varistor 10 receives a static electricity the highest surge current is measured from the displacement of breakdown voltage is occurred within ±10% after the highest inrush current.

Preferred Embodiments

The following Examples 1 through 5 are provided to demonstrate that the disclosed material composition 11 of the present invention is adaptable to manufacture a varistors 10 having several outstanding electrical properties.

Moreover, the present invention further provides a method for manufacturing a varistor whose voltage can be designated as needed. The varistor 10 is constructed of a material composition 11 having a core-shell microstructure which at least comprises a cored-structure 14 wrapped by a shelled-structure 12.

The varistor 10 is made by sintering, the material composition 11 at a relatively lower temperature. In the lower temperature sintering, since shelled-structure 12 made from a glass material has almost no reaction with the material of cored-structure 14, the electrical properties of such varistors 10 can be decided and designated by precisely controlling the size and properties of the grain of cored-structure 14, the thickness and insulation resistance of the insulating layer of the shelled-structure 12, of the interval between two parallel electrodes 21 and the overlap area of the electrodes 21 of the varistors 10.

Example 1

Silicon carbide powders sized between 0.6 µm and 1.0 µm are selected and soaked into a transparent organic solution primarily containing ethyl silicate. Trough pH control of the solution, glass containing in the composition can be evenly precipitated on the surface of the silicon carbide powders. Then the powders are dried and sintered at 600° C. for 2 hours so that the silicon carbide powders coated with silicate glass can be obtained.

The sintered powders are mixed with appropriate binder, dispersant, plasticizer and organic solvent to form an organic paste. The viscosity of the paste is carefully controlled to facilitate the control of the thickness of the green tape to be made. Then doctor blade casting is conducted with the paste to make a green tape wherein the thickness of the green tape is made to 15~200 µm. Afterward, 6 layers of the green tape printed with inner electrodes are stacked in the manner that the inner electrodes alternately appear. For reducing the leakage current and enhancing the stability of the product, the resultant construction is added at the upper and lower end respectively with 5 layers of tape whereon no electrode is printed. The construction is compacted at 70° C. and 3000 lb/in² (psi) and cut at predetermined positions into green grains.

The green grains are further sintered in a sintering furnace at 900° C. for 2 hours. Then the sintered grains are coated with silver paste at the appearing end of the inner electrodes and further treated at 800° C. for 0.5 hour. Thereby, a multiplayer varistor 10 of FIG. 1 sized 1.0×0.5×0.5 is obtained.

At last, the basic electrical properties of the varistor 10, including breakdown voltage (V1 mA), nonlinear exponent (α), leakage current (iL), ESD tolerance and restraining voltage are measured to determine the practicability of the varistor 10.

The measured results are shown in Table 1 and Table 2, wherein Table 1 describes the effect of the amount of the glass on the properties of the varistor 10. According to the results of samples 1 to 5, the larger amount of the glass leads the higher breakdown voltage (V1 mA), the higher nonlinear exponent (α) and the lower leakage current (iL) of the varistor 10.

When the amount of glass is greater than 20%, the leakage current (iL) of the varistor 10 is reduced to a relatively lower level and can pass the electrostatic discharge immunity test of 8 KV.

TABLE 1

| Sample | Glass Percentage (%) | Thickness of the tape (μm) | V1mA (V) | α | iL (μA) | ESD Tolerence (8 KV) |
|---|---|---|---|---|---|---|
| 1 | 10 | 50 | 105.4 | 5.57 | 200.2 | NG |
| 2 | 20 | 50 | 123.7 | 7.59 | 79.0 | Pass |
| 3 | 30 | 50 | 235.1 | 15.08 | 67.9 | Pass |
| 4 | 50 | 50 | 378.1 | — | 9.2 | Pass |
| 5 | 70 | 50 | 676.0 | — | 0.2 | Pass |

Table 2 shows the electrical properties of the varistors 10 made from different thickness of the green tapes sintered at 900° C. It is observed that the breakdown voltages (V1 mA) of the varistors 10 are proportioned to the thickness of the green tapes. The thicker the green tape is, the higher breakdown voltage (V1 mA) of the resultant varistor 10 has.

TABLE 2

| Sample | Thickness of the tape (μm) | V1mA (V) | α | iL (μA) | ESD Tolerence (8 KV) |
|---|---|---|---|---|---|
| 6 | 20 | 80.4 | 11.78 | 63.5 | Pass |
| 7 | 35 | 147.2 | 13.62 | 57.8 | Pass |
| 8 | 50 | 235.1 | 15.08 | 67.9 | Pass |
| 9 | 70 | 301.2 | 14.88 | 62.3 | Pass |

Through the above Tables 1 and 2, it is learned that through controlling the amount of glass and thickness of the green tape, a multiple-layered varistor 10 can be manufactured with designated voltage.

Example 2

In the present example, semi-conductive strontium titanate powders are implemented as the material of the cored-structure of the previous Example 1, while boron glass is used as the material of the shelled-structure. Similarly, the semi-conductive strontium titanate powders are coated with the boron glass and the chip component fabrication is conducted. Then doctor blade casting is conducted to make a green tape of 50 μm thickness and the green tape is made into green grains each having two layers of inner electrodes. The construction is sintered at 850° C. for 2 hours to obtain a multiple-layered varistor 10.

The varistor 10 has electrical properties as shown in Table 3 and can pass the electrostatic discharge immunity test of 8 KV.

TABLE 3

| Sample | Thickness of the tape (μm) | V1mA (V) | α | iL (μA) | ESD Tolerence (8 KV) |
|---|---|---|---|---|---|
| 10 | 50 | 261.8 | 8.76 | 2.9 | Pass |

Example 3

In the present example, metal nickel powders are implemented as the material of the cored-structure of the previous Example 1, while silicate glass is used as the material of the shelled-structure. Similarly, the metal nickel powders are coated with the silicate glass and the chip component fabrication is conducted. Then doctor blade casting is conducted to make a green tape of 30 μm thickness and the green tape is made into green grains each having two layers of inner electrodes. The construction is sintered at 800° C. for 2 hours to obtain a multiple-layered varistor 10.

The varistor 10 has electrical properties as shown in Table 4 and can pass the electrostatic discharge immunity test of 8 KV.

TABLE 4

| Sample | Thickness of the tape (μm) | V1mA (V) | α | iL (μA) | ESD Tolerence (8 KV) |
|---|---|---|---|---|---|
| 11 | 30 | 241.8 | — | 1.22 | Pass |

Example 4

In the present example, metal copper powders are implemented as the material of the cored-structure of the previous Example 1, while silicate glass is used as the material of the shelled-structure. Similarly, the metal copper powders are coated with the silicate glass and the chip component fabrication is conducted. Then doctor blade casting is conducted to make a green tape of 50 μm thickness and the green tape is made into green grains each having two layers of inner electrodes. The construction is sintered at 700° C. for 2 hours to obtain a multiple-layered varistor 10.

The varistor 10 has electrical properties as shown in Table 5 and can pass the electrostatic discharge immunity test of 8 KV.

TABLE 5

| Sample | Thickness of the tape (μm) | V1mA (V) | α | iL (μA) | ESD Tolerence (8 KV) |
|---|---|---|---|---|---|
| 12 | 50 | 548.5 | — | 0.67 | Pass |

Example 5

The research is now directed to the effect of the size of the material on the electrical properties of the components. Differently sized SiC powders ranged from 0.5 to 10 μm are taken as the cored-structure of the previous Example 1. Then the powders are relatively coated with glass and the chip component fabrication is conducted. Then doctor blade casting is conducted to make green tapes of 50 μm thickness and general multiple-layered chip components are obtained.

The electrical properties of the components are listed in Table 6 in which it can be found that the breakdown voltage (V1 mA) of the component is related to the original powder size of the cored-structure. When the cored-structure has a smaller size, the resultant component possesses a lower breakdown voltage (V1 mA).

TABLE 6

| Sample | Thickness of the tape (μm) | V1mA (V) | α | iL (μA) | ESD Tolerence (8 KV) |
|---|---|---|---|---|---|
| 13 | 10.0 | 285.1 | 17.58 | 26.8 | Pass |
| 14 | 2.5 | 254.3 | 17.24 | 27.9 | Pass |
| 15 | 0.8 | 230.6 | 16.04 | 28.6 | Pass |

Although a particular embodiment of the invention has been described in detail for purposes of illustration, it will be understood by one of ordinary skill in the art that numerous variations will be possible to the disclosed embodiments without going outside the scope of the invention as disclosed in the claims.

The invention claimed is:

1. A method for manufacturing a single-layered or multiple-layered varistor comprising a sintered ceramic body having an adjustably designated voltage, comprising steps of:
   a) selecting surge absorbing ceramic powders as raw material, each of said ceramic powders contains a crystalline core-shell microstructure comprising a grain having a predetermined size constructed as a cored-structure made of a sintered conductive or semi-conductive material and a layer of glass having a predetermined thickness constructed as a shelled-structure covered over the cored-structure;
   b) mixing said ceramic powders with appropriate binder, dispersant, plasticizer and organic solvent to form a slurry;
   c) producing green tape(s) made of the slurry through a given doctor blade casting;
   d) stacking a predetermined number of green tape(s) having an inner electrode layer printed thereon in an manner that ends of the inner electrodes alternately appear;
   e) allowing the stacked green tape(s) sintered as a ceramic body at a temperature between 600° C. and 1,100° C., and
   f) the sintered ceramic body having a designated breakdown voltage executed at step a) by precisely controlling either the size of the grain of the cored-structure or the thickness of the glass layer of the shelled-structure of the surge absorbing ceramic powders, or further executed at step c) by precisely controlling each green tape having a thickness ranged between 15 μm and 200 μm.

2. A single-layered or multiple-layered varistor capable of passing ESD immunity test of 8 KV, comprising a sintered ceramic body produced by the method of claim 1, wherein the sintered ceramic body contains inner electrodes interleaved thereof as well as has a whole continuous crystalline glass layer in an amount of greater than 20% formed as an electrostatic discharge (ESD) protection structure and constructed from those shell-structures of all surge absorbing ceramic powders sintered together as a whole.

3. The single-layered or multiple-layered varistor as defined in claim 2, wherein the sintered ceramic body further contains separated grains embedded in the whole continuous crystalline glass layer by way of each grain no contact with the other and each grain is sintered from the cored-structure of the surge absorbing ceramic powder which is made of a conductive material selected from the group consisting of Fe, Al, Ni, Cu, Ag, Au, Pt, Pd and alloy thereof, or a semi-conductive material selected from the group consisting of $ZnO$, $SrTiO_3$, $BaTiO_3$, $SiC$, $TiO_2$, $SnO_2$, $Si$ and $GaAs$.

* * * * *